United States Patent
Devaux et al.

(10) Patent No.: US 6,870,977 B2
(45) Date of Patent: Mar. 22, 2005

(54) MONOLITHIC INTEGRATED OPTICAL COMPONENT INCLUDING A MODULATOR AND A HETEROJUNCTION BIPOLAR TRANSISTOR

(75) Inventors: Fabrice Devaux, Montrouge (FR); Sylvain Blayac, Paris (FR); Philippe Andre, Toulouse (FR)

(73) Assignee: Avanex Corporation, Fremont, CA (US)

( * ) Notice: Subject to any disclaimer, the term of this patent is extended or adjusted under 35 U.S.C. 154(b) by 168 days.

(21) Appl. No.: 10/074,023

(22) Filed: Feb. 14, 2002

(65) Prior Publication Data

US 2002/0110309 A1 Aug. 15, 2002

(30) Foreign Application Priority Data

Feb. 15, 2001 (FR) .............................................. 01 02100

(51) Int. Cl.[7] ................................................ G02B 6/12
(52) U.S. Cl. .......................................... 385/14; 257/197
(58) Field of Search ............................ 385/14; 257/183, 257/197

(56) References Cited

U.S. PATENT DOCUMENTS 5,391,869 A * 2/1995 Ade et al. ............... 250/227.24

FOREIGN PATENT DOCUMENTS

| FR | 2 663 161 A1 | 12/1991 | | |
|---|---|---|---|---|
| FR | 2 768 524 A1 | 3/1999 | | |
| GB | 2243241 A | * 10/1991 | ........... | H01L/27/14 |
| JP | 58 151087 A | 9/1983 | | |

OTHER PUBLICATIONS

Yu–Heng Jan et al.; "Vertical Monolithic Integration of a GAAS/ALGAAS V–Channeled Substrate Inner Stripe Laser Diode and A Heterojunction Bipolar Transistor" Applied Physics Letters, American Institute of Physics.New York, US, vol. 57, No. 26, Dec. 24, 1990, pp. 2750–2752.

Yoshitaka Okada et al: "Optical Intensity Modulator for.Integrated Optics by use of a Heterojuntion Bipolar Transistor Waveguide Structure" Applied Physics Letters, American Institute of Physics. New York, US, vol. 55, No. 25, Dec. 18, 1989, pp. 2591–2593, XP000126806.

* cited by examiner

*Primary Examiner*—Rodney Bovernick
*Assistant Examiner*—Juliana K. Kang
(74) *Attorney, Agent, or Firm*—Moser, Patterson & Sheridan, L.L.P.

(57) ABSTRACT

A monolithic integrated optical component includes a control transistor connected to an electro-optical component including an active waveguide and at least one input waveguide and one output waveguide. The transistor is a heterojunction bipolar transistor including at least one sub-collector layer that is common to a confinement layer of the electro-optical component. The active waveguide of the electro-optical component includes a widened structure under a contact area of the heterojunction bipolar transistor and having substantially the same surface area as the transistor.

8 Claims, 1 Drawing Sheet

MONOLITHIC INTEGRATED OPTICAL COMPONENT INCLUDING A MODULATOR AND A HETEROJUNCTION BIPOLAR TRANSISTOR

CROSS-REFERENCE TO RELATED APPLICATIONS

This application is based on French Patent Application No. 01 02 1 00 filed Feb. 15, 2001, the disclosure of which is hereby incorporated by reference thereto in its entirety, and the priority of which is hereby claimed under 35 U.S.C. §119.

BACKGROUND OF THE INVENTION

1. Field of the invention

The invention relates to electronic and electro-optical components based on crystal materials (for example III-V materials) for applications to transmitting data over optical fibers at high bit rates.

The invention relates more specifically to an integrated monolithic optical component including an electronic element and an electro-optical element, such as a transistor connected to a modulator to implement voltage control of the modulator.

The present invention seeks to improve the performance of the combination consisting of the electronic element and electro-optical element.

2. Description of the prior art

A conventional electro-optical modulator includes a stack of layers grown epitaxially on a III-V semiconductor material substrate, usually an InP substrate. The successive layers consist of a bottom confinement layer, an active layer, and a top confinement layer, these three layers forming the active waveguide of the component. The active layer is generally a layer of an undoped single quaternary compound, for example InGaAsP. The confinement layers consist of a III-V material, for example InP, each doped with a different type of carrier and one forming the anode and the other forming the cathode.

The modulator is generally controlled by a voltage source, for example a transistor, whose impedance can be as high as 50 Ω. The resulting cut-off frequency is then given by the equation:

$$fc = 1/(2\pi(R_S + R_L)C_m)$$

where $R_S \approx 5\ \Omega$, the series resistance of the modulator, $R_L$ is the impedance of the control source, and $C_m$ is the capacity of the modulator.

It follows that the performance of the modulator is not optimized and that the range of operating frequencies of an InP electro-optical modulator is one fifth to one tenth of that imposed by the intrinsic limitations of the material. This is particularly prejudicial in the case of high bit rate applications using modulators operating at bit rates from 40 Gb/s to 160 Gb/s.

Consideration has been given to minimizing or even eliminating the transport of electrical charges between the source and the modulator, in order to reduce the impedance of the control source. This has been attempted by moving two elements physically close together. However, this solution does not totally prevent interference between the source and the modulator. A stray resistance of only 1 Ω can reduce the bandwidth below 40 GHz.

Another prior art solution uses monolithic integration of the modulator with the control transistor by integrating the active layer of the modulator into the structure of the transistor (into the collector layer).

This solution has drawbacks, however. The active layer of the modulator is in the depletion area of the collector, and in the equivalent circuit diagram this amounts to connecting the modulator in series with the collector. As there is then no longer access to one layer of the modulator, current control is used rather than voltage control. Current control implies a high load resistance, which can even exceed 50 Ω. The bandwidth of the modulator is therefore not increased.

The object of the present invention is to propose integration of the opto-electronic component with the electrical control element in such a manner as to minimize stray resistances and enable optimum operation of the electro-optical component.

To this end, the invention proposes using a heterojunction bipolar transistor (HBT) as the voltage control source and monolithic integration of the electro-optical component into the HBT.

In accordance with the present invention, the electro-optical component is integrated into the sub-collector layer of the HBT, which advantageously constitutes one confinement layer of said component.

To this end, the active structure of the electro-optical component must be widened so that the sub-collector layer directly constitutes the top confinement layer of said component. The electro-optical component must be widened because the size of the transistor cannot be reduced below a limiting value imposed by fabrication and design constraints.

However, widening the active waveguide of the electro-optical component eliminates monomode propagation of the signal in the component. The invention consequently proposes to lengthen the widened area of the active waveguide of the component, which is situated under the HBT, in order to transform the widened area into a multimode interference coupler including a monomode input waveguide and a monomode output waveguide.

SUMMARY OF THE INVENTION

The invention provides a monolithic integrated optical component including a control transistor connected to an electro-optical component including an active waveguide and at least one input waveguide and one output waveguide, in which component the transistor is a heterojunction bipolar transistor including at least one sub-collector layer that is common to a confinement layer of the electro-optical component, and the active waveguide of the electro-optical component includes a widened structure under a contact area of the heterojunction bipolar transistor and having substantially the same surface area as the transistor.

According to one features of the invention the widened structure of the active waveguide is lengthened in such a manner as to constitute a multimode interference coupler.

The features and advantages of the invention will become clearly apparent after reading the following description, which is given by way of illustrative and non-limiting example and with reference to the accompanying drawings.

DETAILED DESCRIPTION OF THE PREFERRED EMBODIMENT

Figure 1:
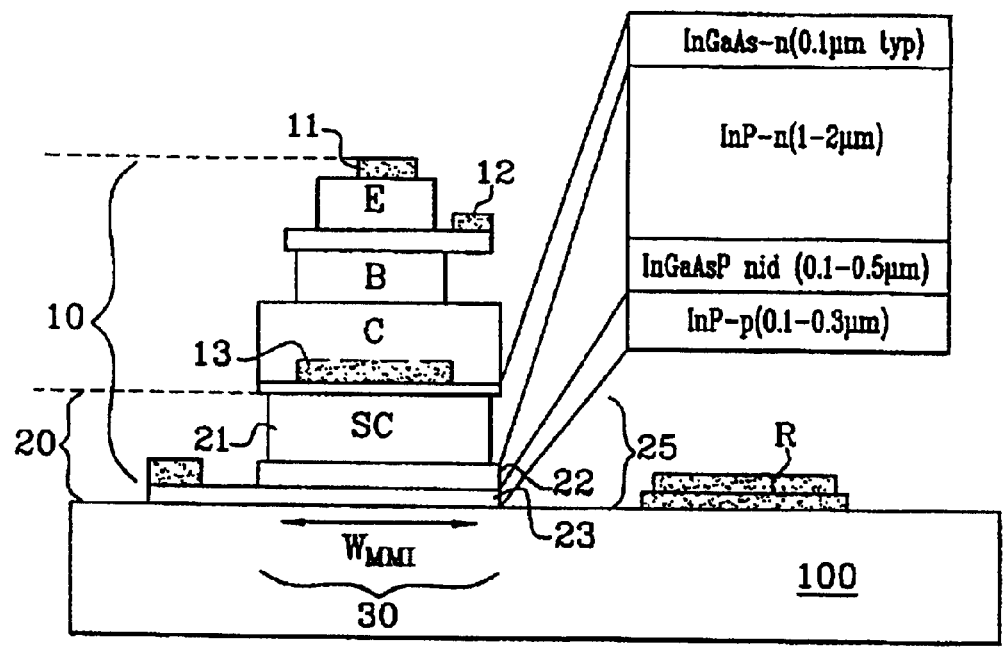
FIG. 1 is a diagram showing a stack of epitaxially grown layers of a monolithic integrated optical component according to the invention.

The present invention seeks to reduce the impedance of the control source of an electro-optical component. To this end, the invention proposes to integrate said electro-optical component into said control source, which consists of a heterojunction bipolar transistor (HBT) 10. This integration is shown clearly in the FIG. 1 diagram.

The heterojunction bipolar transistor is a proven technology. It generally consists of several epitaxially grown layers on a substrate 100 of a III-V semiconductor material, typically InP. The various epitaxially grown layers are etched to constitute mesas that define the collector C, the base B and the emitter E of the transistor 10. Electrical contacts 11, 12, 13 must be formed on each mesa by depositing metal areas (also referred to as contact areas).

The heterojunction is generally situated between the base B and the emitter E, the corresponding layers consisting of different semiconductor materials, for example, an InGaAs base layer B and an InP emitter layer E with different types of doping. The heterojunction authorizes very high doping of the base, enabling a very thin base to be produced. Thus operating frequencies are very high.

Depending on the application, a bipolar transistor can be a single heterojunction device or a double heterojunction device, and in the latter case the second heterojunction is between the base and the collector and based on the same principle of appropriate epitaxially grown layers.

The collector layer C can be deposited on an intermediate sub-collector layer SC rather than directly on the substrate 100. The sub-collector layer SC consists of a semiconductor material different from that of the collector but with the same type of doping. The metal contact 13 of the collector C is then formed on the sub-collector layer SC.

According to one essential feature of the invention, the electro-optical component 20 is disposed under the control transistor 10 and the sub-collector layer SC of said transistor 10 constitutes the top confinement layer 21 of the component 20.

In the FIG. 1 example, the electro-optical component 20 is a modulator whose active waveguide 25 consists of a top confinement layer 21, an active layer 22 and a bottom confinement layer 23 deposited on the substrate 100.

In other applications of the invention, the electro-optical component can be a laser source, a photodiode, a semiconductor optical amplifier, etc.

To implement the invention, the active waveguide 25 of the electro-optical component 20 must be widened so that the sub-collector layer SC of the HBT 10 directly constitutes the top confinement layer 21 of said component 20.

The width of a standard active waveguide is much smaller than that of a transistor (around one tenth the size). The size of the HBT 10 cannot be reduced below a limit value. The electro-optical component 20 must therefore be widened.

Accordingly, the active waveguide 25 of the electro-optical component 20 includes a widened structure 30 under the contact area 13 of the HBT 10 and having substantially the same surface area as the sub-collector layer SC of the transistor 10.

However, widening the active waveguide 25 eliminates monomode propagation of the signal in the electro-optical component 20. The invention therefore proposes to lengthen the widened structure 30 of the electro-optical component 20 in order to transform it into a multimode interference coupler (MMIC) including a monomode input waveguide 26 and a monomode output waveguide 27 (1×1 MMIC). Lengthening the widened structure 30 of the electro-optical component 20 in this way necessarily entails lengthening the sub-collector layer SC of the HBT 10, but this does not compromise in any way correct operation of the transistor.

Figure 2:
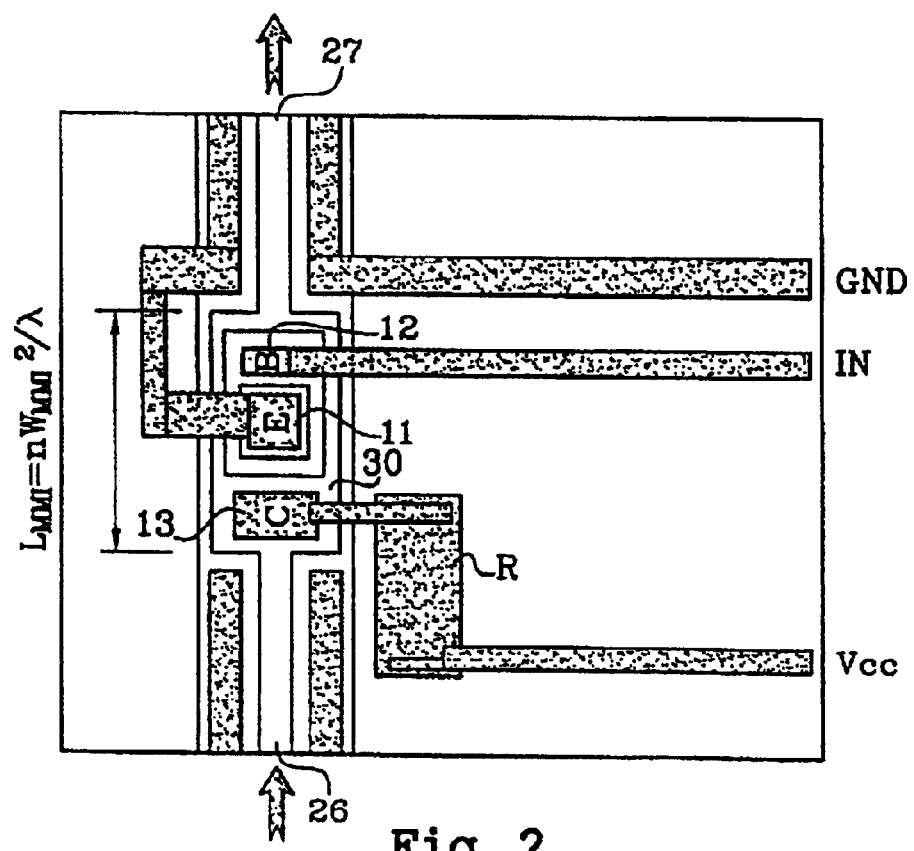
FIG. 2 is a diagram showing a top view of the component according to the invention.

Referring to FIG. 2, the length $L_{MMI}$ of the widened structure 30 of the electro-optical component 20 is related directly to its width $W_{MMI}$ by the following equation:

$$L_{MMI} = n \times W_{MMI}^2 / \lambda$$

where n is the effective index of the waveguide 25, and λ is the wavelength of the optical signal propagating in the electro-optical component 20.

Without departing from the scope of the invention, consideration may be given to applying integration of the electro-optical component with a HBT to the situation where said component has N monomode input waveguides and N monomode output waveguides.

Implementing the invention uses proven fabrication processes.

The electro-optical component 20 and the heterojunction bipolar transistor 10 are integrated on a substrate 100, for example a semi-insulating InP substrate by epitaxially depositing a stack of successive layers using well known processes enabling close control of the thickness and the composition of each epitaxially grown layer. FIG. 1 shows the stack of successive layers clearly.

The invention advantageously reduces the series resistance between the electro-optical component 20 and the control transistor 10 by eliminating the stray resistances associated with the metallic contacts between the two elements. A series resistance of 3 Ω has been obtained in practice. With this low a series resistance, the modulator 20 can be controlled by a source having an impedance of 10 Ω. The bandwidth can therefore be increased by a factor of 2 to 3 compared to the current bandwidth, all other parameters remaining exactly the same. It is therefore possible to approach more closely the intrinsic limits of the device.

Integrating the electro-optical component into the control transistor generates heat which can compromise the performance of the component. Also, an MMIC induces approximately 1 dB of optical losses. However, these drawbacks are negligible in comparison to the improvements made by the present invention.

What is claimed is:

1. A monolithic integrated optical component including a control transistor connected to an electro-optical component including an active waveguide and at least one input waveguide and one output waveguide, in which component said transistor is a heterojunction bipolar transistor including at least one sub-collector layer that is common to a confinement layer of said electro-optical component, and said active waveguide of said electro-optical component includes a widened structure under a contact area of said heterojunction bipolar transistor and having substantially the same surface area as said transistor.

2. The optical component claimed in claim 1 wherein said widened structure of said active waveguide is lengthened in such a manner as to constitute a multimode interference coupler.

3. The optical component claimed in claim 2 wherein said multimode interference coupler has one input waveguide and one output waveguide.

4. The optical component claimed in claim 2 wherein said multimode interference coupler has N input waveguides and N output waveguides.

5. The optical component claimed in claim 1 wherein said electro-optical component is a modulator.

6. The optical component claimed in claim 1 wherein said electro-optical component is a laser source.

7. The optical component claimed in claim 1 wherein said electro-optical component is a photodiode.

8. The optical component claimed in claim 1 wherein said electro-optical component is a semiconductor optical amplifier.

* * * * *